United States Patent
Ishii et al.

(10) Patent No.: US 7,857,992 B2
(45) Date of Patent: *Dec. 28, 2010

(54) WHITE LIGHT-EMITTING LAMP, BACKLIGHT USING SAME, DISPLAY AND ILLUMINATING DEVICE

(75) Inventors: Tsutomu Ishii, Yokohama (JP);
Yasuhiro Shirakawa, Yokohama (JP);
Yasumasa Ooya, Yokohama (JP)

(73) Assignees: Kabushiki Kaisha Toshiba, Tokyo (JP);
Toshiba Materials Co., Ltd., Yokohama-shi (JP)

( * ) Notice: Subject to any disclaimer, the term of this patent is extended or adjusted under 35 U.S.C. 154(b) by 647 days.

This patent is subject to a terminal disclaimer.

(21) Appl. No.: 11/908,611

(22) PCT Filed: Feb. 24, 2006

(86) PCT No.: PCT/JP2006/303418

§ 371 (c)(1),
(2), (4) Date: Sep. 14, 2007

(87) PCT Pub. No.: WO2006/098132

PCT Pub. Date: Sep. 21, 2006

(65) Prior Publication Data

US 2009/0026916 A1    Jan. 29, 2009

(30) Foreign Application Priority Data

Mar. 14, 2005  (JP)  ............... 2005-070322

(51) Int. Cl.
*C09K 11/06* (2006.01)

(52) U.S. Cl. .................... 252/301.16; 257/88; 313/503; 313/364

(58) Field of Classification Search ............ 252/301.16; 257/88; 313/503, 364; 428/690
See application file for complete search history.

(56) References Cited

U.S. PATENT DOCUMENTS

2006/0071587 A1*   4/2006   Yamaguchi et al. ......... 313/364

(Continued)

FOREIGN PATENT DOCUMENTS

JP        2000 73052        3/2000

(Continued)

OTHER PUBLICATIONS

English Translation of JP2000-073052, published 2000.*

(Continued)

*Primary Examiner*—Nimeshkumar D Patel
*Assistant Examiner*—Mary Ellen Bowman
(74) *Attorney, Agent, or Firm*—Oblon, Spivak, McClelland, Maier & Neustadt, L.L.P.

(57)   ABSTRACT

A white light-emitting lamp (1) includes a semiconductor light-emitting device such as a LED chip (2) which has an emission wavelength of 360 nm or more and 440 nm or less, and a light-emitting part including a blue light-emitting phosphor, a green light-emitting phosphor and a red light-emitting phosphor, which emits white light when excited by light from the LED chip (2). At least one phosphor selected from Eu activated halophosphate phosphors and Eu activated aluminate phosphors is used as the blue light-emitting phosphor, Au and Al activated zinc sulfide phosphor is used as the green light-emitting phosphor, and at least one phosphor selected from Eu and Sm activated lanthanum sulfide phosphors and Cu and Mn activated zinc sulfide phosphors is used as the red light-emitting phosphor.

17 Claims, 3 Drawing Sheets

U.S. PATENT DOCUMENTS

2009/0272985 A1* 11/2009 Ishii et al. .................. 257/88

FOREIGN PATENT DOCUMENTS

JP         2004 331934       11/2004

OTHER PUBLICATIONS

English Translation of JP2004-331934, published 2004.*
K. Tadatomo, et al., "Development of White LED Fabricated by RGB Phosphor and Near Ultra-Violet LED", Mitsubishi Cable Industries Journal, pp. 35-41, 2002.

* cited by examiner

WHITE LIGHT-EMITTING LAMP, BACKLIGHT USING SAME, DISPLAY AND ILLUMINATING DEVICE

TECHNICAL FIELD

The present invention relates to a white light-emitting lamp including a semiconductor light-emitting device having an emission wavelength of 360 to 440 nm, a backlight using the same, a display and an illuminating device.

BACKGROUND ART

A light emitting diode (LED) is a semiconductor light-emitting device which converts electrical energy into ultraviolet light or visible light to emit it, and has advantages that it has a long life and high reliability, and when it is used as a light source, its replacement works are reduced. A LED lamp having a LED chip sealed with, for example, a transparent resin is used extensively for a backlight of a liquid crystal display which is used for a display unit of portable communication devices, PC peripheral devices, office automation equipment, home electric appliances and the like, and for signal equipment, various types of switches, vehicle-mounted lamps, and illuminating devices such as general lighting and the like.

A color tone of light emitted from the LED lamp is not limited to an emission wavelength of the LED chip, but light in a visible light region ranging from blue to red can be obtained for usage by, for example, applying phosphors to the surface of the LED chip or containing phosphors into the transparent resin for sealing the LED chip. Especially, a white light-emitting LED lamp (white LED lamp) is spreading quickly for usage as the backlight of a display unit of portable communication devices, vehicle-mounted lamps and the like, and its use is expected to be increased drastically as a replacement for the fluorescent lamp in the future.

At present, as the white LED lamps which are becoming popular or being tried and tested, there are known a LED lamp which combines a blue light-emitting LED and a yellow light-emitting phosphor (YAG or the like), and a LED lamp which combines an ultraviolet emission LED having an emission wavelength of 360 to 440 nm and a mixture of individual phosphors of blue, green and red (three-color mixed phosphor/BGR phosphor). At present, the former white LED lamp using the blue light-emitting LED is spreading more quickly because it excels in luminance characteristics to the latter.

But, the former white LED lamp has disadvantages that it looks yellowish depending on a direction, and an uneven yellow or blue color appears when projected on a white surface. Therefore, sometimes the former white LED lamp is also called pseudo-white. An average color rendering index indicating the quality of white light of the former white LED lamp is also limited to a range of 70 to 75.

Meanwhile, the white LED lamp using the latter ultraviolet emission LED is inferior in luminance to the former, but nonuniformity in light emission as well as projection light is slight, and it is expected to become mainstream of the white lamp for lighting in the future and being developed quickly. The white LED lamp using the above ultraviolet emission LED has the color rendering properties and the lamp characteristics such as luminance affected by the characteristics of the individual phosphors of blue, green and red and also the combinations of the phosphors. Therefore, the selection and combination of the individual phosphors of blue, green and red are now under consideration.

For example, Nonpatent Literature 1 describes a white LED lamp which combines an ultraviolet emission LED and a BGR phosphor. Here, a Eu-activated halophosphate phosphor or a Eu-activated aluminate phosphor is used as a blue light-emitting phosphor, a Cu and Al-activated zinc sulfide phosphor or a Eu and Mn-activated aluminate phosphor is used as a green light-emitting phosphor, and a Eu-activated yttrium oxysulfide phosphor is used as a red light-emitting phosphor.

Patent Literature 1 describes that a white LED lamp provided with an ultraviolet emission LED uses a Eu-activated halophosphate phosphor or a Eu-activated aluminate phosphor as a blue light-emitting phosphor, a Eu and Mn-activated aluminate phosphor as a green light-emitting phosphor, and a Eu-activated lanthanum oxysulfide phosphor as a red light-emitting phosphor.

A conventional white LED lamp has high color rendering properties and the uniformity of light emission which are features of the lamp using an ultraviolet emission LED, but its luminance characteristics are insufficient, and further improvement is being requested. To achieve both the high color rendering properties and high luminance by the white LED lamp using the ultraviolet emission LED, it is necessary that light at around 450 nm, around 560 nm and around 620 nm, where there are peaks of human color sensitivity in terms of the white light spectrum, are included in a good balance, and the individual phosphors of blue, green and red luminescent components are well balanced in luminous efficiency.

But, among the individual phosphors used for the conventional white LED lamp, the red light-emitting phosphor is poor in luminous efficiency with respect to the ultraviolet light or purple light at a wavelength of 380 nm or more in comparison with the other phosphor, so that it has become apparent that the luminance characteristics of the white LED lamp cannot be improved sufficiently. The properties of the blue and green light-emitting phosphors cannot be exerted enough because of the red light-emitting phosphor which is poor in luminous efficiency, resulting in deterioration of the luminance characteristics. Nonpatent Reference 1: Mitsubishi Cable Industries Review, No. 99, July 2002

Patent Reference 1: JP-A 2000-073052 (KOKAI)

SUMMARY OF THE INVENTION

According to an aspect of the present invention, there is provided a white light-emitting lamp using a semiconductor light-emitting device having an emission wavelength of 360 to 440 nm and having both high color rendering properties and high luminance achieved by improving a combination of individual phosphors as a blue luminescent component, a green luminescent component and a red luminescent component.

A white light-emitting lamp according to an aspect of the present invention comprises: a semiconductor light-emitting device having an emission wavelength in a range of 360 nm or more and 440 nm or less; and a light-emitting part, which is excited by light from the semiconductor light-emitting device to emit white light, including a blue light-emitting phosphor which is composed of at least one selected from a europium-activated halophosphate phosphor and a europium-activated aluminate phosphor, a green light-emitting phosphor which is composed of a gold and aluminum-activated zinc sulfide phosphor, and a red light-emitting phosphor which is composed of at least one selected from a europium and samarium-activated lanthanum oxysulfide phosphor and a copper and manganese-activated zinc sulfide phosphor.

A backlight according to another aspect of the invention is provided with the white light-emitting lamp according to the aspect of the invention. A display according to still another aspect of the invention comprises: a backlight which is provided with the white light-emitting lamp according to the aspect of the invention; and a display unit which is disposed on a side of the light emission surface of the backlight. A illuminating device according to still another aspect of the invention is provided with the white light-emitting lamp according to the aspect of the invention.

EXPLANATION OF REFERENCE NUMERALS

1: White LED lamp, 2: LED chip, 3A, 3B: lead terminal, 4: wiring board, 5: bonding wire, 6: resin frame, 7: reflective layer, 8: transparent resin, 9: three-color mixed phosphor, 10: light-emitting part, 20: backlight, 20A: sidelight type backlight, 20B: directly-beneath type backlight, 21: wiring layer, 22: substrate, 30, 40: liquid crystal display, 31: emission system, 32: light guide plate, 33: reflective layer, 34: color liquid crystal display unit.

MODE FOR CARRYING OUT THE INVENTION modes of conducting the present invention will be described below with reference to the figures. Embodiments of the present invention are described with reference to the figures, which are provided for illustration only, and the present invention is not limited to the figures.

Figure 1:
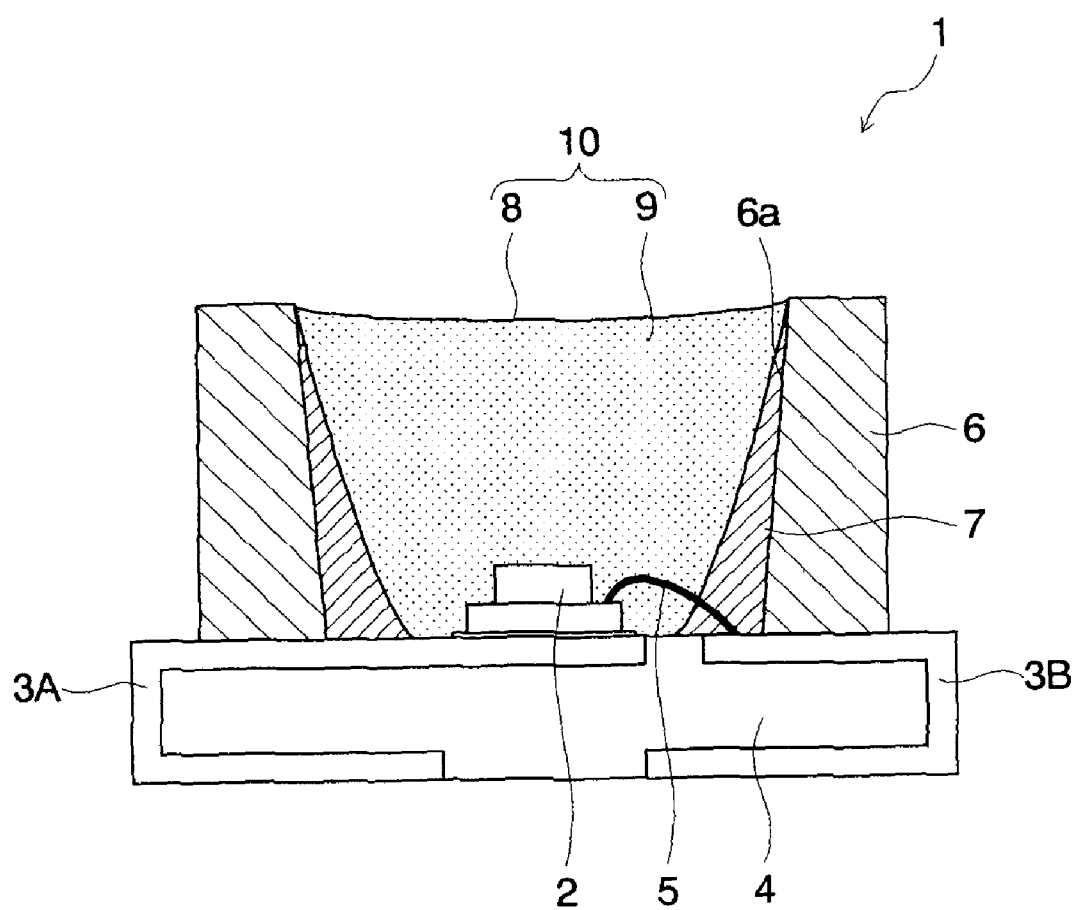
FIG. 1 is a sectional view showing a structure of the white light-emitting lamp according to an embodiment of the present invention.

FIG. 1 is a sectional view showing a structure of a white light-emitting lamp according to an embodiment of the invention. The white light-emitting lamp 1 shown in the figure is a white light-emitting LED lamp (white LED lamp) having a LED chip 2 having an emission wavelength in a range of 360 nm or more and 440 nm or less as a light source (exciting source). The light source of the white light-emitting lamp 1 is not limited to the LED chip 2 but may be a laser diode (semiconductor laser) or the like. For the light source of the white light-emitting lamp 1, a semiconductor light-emitting device having an emission wavelength of 360 nm or more and 440 nm or less is used.

The LED chip 2 as the light source of the white LED lamp 1 is mounted on a wiring board 4 having a pair of lead terminals 3A, 3B. A lower electrode of the LED chip 2 is electrically and mechanically connected to the lead terminal 3A. An upper electrode of the LED chip 2 is electrically connected to the lead terminal 3B via a bonding wire 5.

For the LED chip 2, an ultraviolet emission LED which emits ultraviolet light or purple light having a wavelength in a range of 360 to 440 nm is used. As the ultraviolet light-emitting LED chip 2, a LED chip having a nitride based compound semiconductor layer as the light emission layer is exemplified. If the LED chip 2 has an emission wavelength not falling in the above-described range, white light having high luminance and high color rendering properties cannot be obtained. It is more desirable that the LED chip 2 has an emission wavelength in a range of 370 to 430 nm.

A cylindrical resin frame 6 is disposed on the wiring board 4, and a reflection layer 7 is formed on its inner wall surface 6a. The resin frame 6 is filled with a transparent resin 8 as a resin layer, and the LED chip 2 is embedded in the transparent resin 8. The transparent resin 8 in which the LED chip 2 is embedded contains a white lamp phosphor (BGR phosphor) 9 including a blue light-emitting phosphor, a green light-emitting phosphor and a red light-emitting phosphor. The phosphor 9 dispersed in the transparent resin 8 is excited by ultraviolet light or purple light which is emitted from the LED chip 2 to emit white light.

The electrical energy applied to the white LED lamp 1 is converted to ultraviolet light or purple light by the LED chip 2, and the light is converted to light having a longer wavelength by the white light-emitting phosphor 9 dispersed into the transparent resin 8. The white light which is based on the white light-emitting phosphor 9 contained in the transparent resin 8 is emitted from the LED lamp 1. The transparent resin(resin layer) 8 containing the white light-emitting phosphor 9 functions as a light-emitting part 10 and is disposed at a front side in a light emission direction of the LED chip 2.

The white LED lamp (white light-emitting lamp) 1 is configured of the above-described light-emitting part 10 and the LED chip 2 as the light source. For the transparent resin 8 contained in the white light-emitting phosphor 9, for example, a silicone resin, an epoxy resin or the like can be used. The white light-emitting phosphor 9 is dispersed into the entire transparent resin 8. The white light-emitting phosphor 9 may be partially dispersed into the transparent resin 8. In addition, the white light-emitting phosphor 9 may contain supplementarily phosphors having emission colors other than blue, green and red.

For the individual phosphors of blue, green and red configuring the white light-emitting phosphor 9, it is desirable to use a phosphor which efficiently absorbs ultraviolet light or purple light having a wavelength in a range of 360 to 440 nm emitted from the LED chip 2. For the blue light-emitting phosphor, at least one selected from a europium (Eu)-activated halophosphate phosphor and a europium (Eu)-activated aluminate phosphor excelling in ultraviolet light or purple light absorption efficiency is used.

As the Eu-activated halophosphate phosphor, there is used, for example, a phosphor having a composition which is represented by the general formula:

$$(M1_{1-c},Eu_c)_{10}(PO_4)_6 \cdot Cl_2 \qquad (1)$$

(where, M1 denotes at least one element selected from Mg, Ca, Sr and Ba, and c denotes a number meeting $0.005 \leq c \leq 0.03$).

As the Eu-activated aluminate phosphor, there is used, for example, a phosphor having a composition which is represented by the general formula:

$$m(M2_{1-d},Eu_d)O \cdot nAl_2O_3 \qquad (2)$$

(where, M2 denotes at least one element selected from Mg, Ca, Sr, Ba and Zn, and d, m and n are numbers meeting $0.05 \leq d \leq 0.3$, $0 < m$, $0 < n$, $0.2 \leq m/n \leq 1.5$).

For the red light-emitting phosphor, at least one selected from a europium (Eu) and samarium (Sm)-activated lanthanum oxysulfide phosphor and a copper (Cu) and manganese (Mn)-activated zinc sulfide phosphor is used. These phosphors each can be used as the red luminescent component of the white LED lamp 1.

As the Eu and Sm-activated lanthanum oxysulfide phosphor, there is used, for example, a phosphor having a composition which is represented by the general formula:

(where, a and b are numbers meeting $0.01 \leq a \leq 0.15$, $0.0001 \leq b \leq 0.03$).

As the Cu and Mn-activated zinc sulfide phosphor, there is used, for example, a phosphor having a composition which is represented by the general formula:

(where, v and w are numbers meeting $0.0002 \leq v \leq 0.001$, $0.005 \leq w \leq 0.014$).

The red light-emitting phosphors represented by the formula (3) and the formula (4) each can be used as a red luminescent component which is emitted by ultraviolet light or purple light emitted from the LED chip 2. Considering the emission properties (emission intensity etc.) of the red luminescent component, at least the Eu and Sm-activated lanthanum oxysulfide phosphor is preferably used as the red luminescent component. When the Eu and Sm-activated lanthanum oxysulfide phosphor alone is used, the red luminescent component is not enough, so that it is effective to use the Cu and Mn-activated zinc sulfide phosphor together.

The red light-emitting phosphors represented by the formula (3) and the formula (4) are excellent in absorption efficiency of ultraviolet light or purple light having a wavelength in a range of 360 to 440 nm in comparison with another red light-emitting phosphor. But, they do not necessarily have a sufficient luminous efficiency in comparison with the blue light-emitting phosphor and the green light-emitting phosphor. The Eu and Sm-activated lanthanum oxysulfide phosphor and the Cu and Mn-activated zinc sulfide phosphor are used together to reinforce the red luminescent component but poor in luminous efficiency in comparison with the blue light-emitting phosphor and the green light-emitting phosphor.

Therefore, the white LED lamp 1 of this embodiment uses a green light-emitting phosphor containing a larger amount of a long wavelength component in comparison with a conventional green component. Specifically, in the white light-emitting phosphor 9 configuring the light-emitting part 10, a gold (Au) and aluminum (Al)-activated zinc sulfide phosphor is used as a green light-emitting phosphor.

As the Au and Al-activated zinc sulfide phosphor, there is used, for example, a phosphor having a composition which is represented by the general formula:

(where, x and y are numbers meeting $0.0002 \leq x \leq 0.0015$, $0.0001 \leq y \leq 0.0012$).

If the value x (molar ratio of Au to 1 mol of ZnS) in the formula (5) is less than 0.0002, desirable emission colors cannot be obtained because emission chromaticity is deviated toward blue. Meanwhile, if the value x exceeds 0.0015, a body color of the phosphor is deteriorated and luminance is lowered. If the value y (molar ratio of Al to 1 mol of ZnS) in the formula (5) is less than 0.0001, Au is prevented from being contained in the zinc sulfide, resulting in lowering the luminance. Meanwhile, if the value y exceeds 0.0012, the body color of the phosphor is deteriorated, resulting in lowering the luminance.

Figure 2:
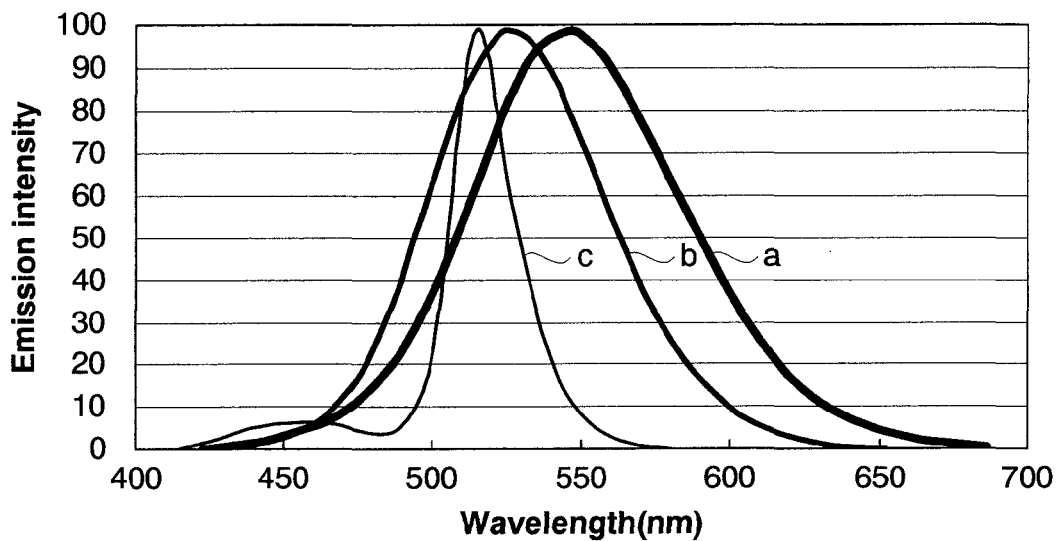
FIG. 2 is a diagram showing an example of an emission spectrum of a green light-emitting phosphor applied to an embodiment of the invention in comparison with a conventional green light-emitting phosphor.

FIG. 2 shows an emission spectrum (a) of the Au and Al-activated zinc sulfide phosphor (ZnS:Au, Al phosphor) in comparison with an emission spectrum (b) of a conventional Cu and Al-activated zinc sulfide phosphor (ZnS:Cu, Al phosphor) and an emission spectrum (c) of a Eu and Mn-activated aluminate phosphor (3(Ba, Mg, Eu, Mn)O.8Al$_2$O$_3$ phosphor). It is apparent from FIG. 2 that the zinc sulfide phosphor activated by Au and Al contains a large amount of a long wavelength component in comparison with the conventional Cu and Al-activated zinc sulfide phosphor and Eu and Mn-activated aluminate phosphor. Thus, the red luminescent component can be reinforced.

The above-described white light-emitting phosphor 9 includes light of around 450 nm, around 560 nm and around 620 nm in good balance, so that color rendering properties of white light can be enhanced. In addition, since a green light-emitting phosphor including the Au and Al-activated zinc sulfide phosphor (ZnS:Au, Al phosphor) containing a larger amount of a long wavelength component in comparison with a conventional green luminescent component is used, insufficient light emission due to the red light-emitting phosphor can be reinforced.

As described above, since a luminance balance of the individual luminescent components of blue, green and red is improved by using the Au and Al-activated zinc sulfide phosphor as the green light-emitting phosphor, luminance characteristics of the white LED lamp 1 using the ultraviolet light-emitting LED chip 2 can be enhanced. Therefore, the white LED lamp 1 which has both the high color rendering properties and high luminance balanced can be realized.

Improvement effects of the luminance characteristics of the white LED lamp 1 by the green light-emitting phosphor (ZnS:Au, Al phosphor) can be obtained even when either the Eu and Sm-activated lanthanum oxysulfide phosphor or the Cu and Mn-activated zinc sulfide phosphor is used as the red light-emitting phosphor. In addition, to obtain the improvement effects of the luminance characteristics by the red light-emitting phosphor itself, it is desirable to use both the Eu and Sm-activated lanthanum oxysulfide phosphor and the Cu and Mn-activated zinc sulfide phosphor together for the red light-emitting phosphor as described above.

When the Eu and Sm-activated lanthanum oxysulfide phosphor and the Cu and Mn-activated zinc sulfide phosphor are used together for the red light-emitting phosphor, the red luminescent component can be reinforced more. Therefore, the luminance characteristics of the white LED lamp 1 can be enhanced furthermore. A mixing ratio of the red light-emitting phosphors is desirably determined such that, for example, a mass ratio of the Eu and Sm-activated lanthanum oxysulfide phosphor and the Cu and Mn-activated zinc sulfide phosphor is in a range of 8:2 to 3:7 though variable depending on a color temperature of the target white light.

Figure 3:
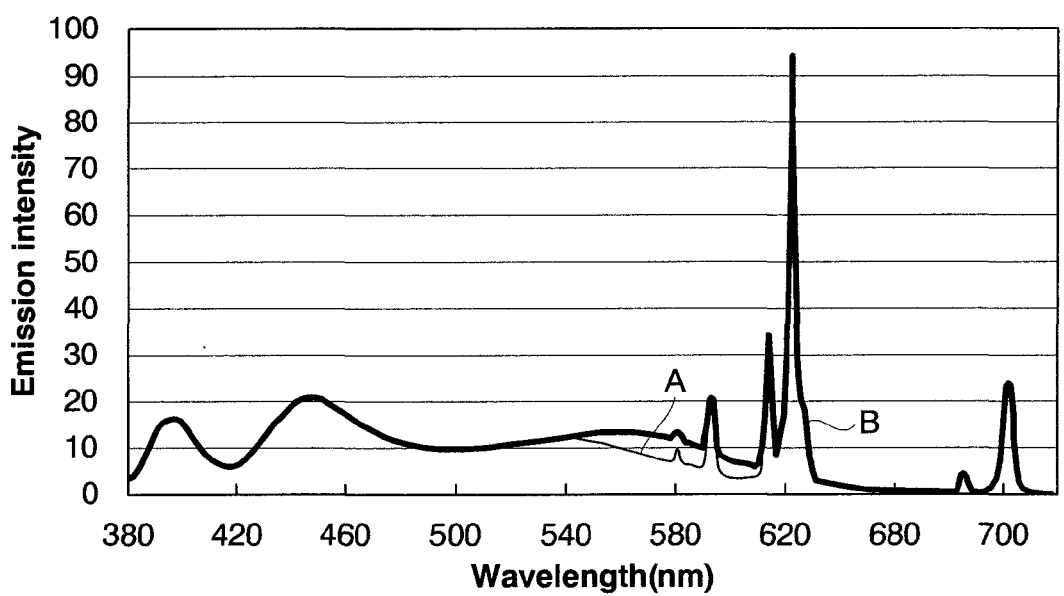
FIG. 3 is a diagram showing an example of an emission spectrum of a three-color mixed phosphor (BGR phosphor) applied to an embodiment of the invention.

FIG. 3 shows an example of an emission spectrum of the white LED lamp 1 using the three-color mixed phosphor 9 containing the above-described individual phosphors of blue, green and red. In FIG. 3, an emission spectrum [A] is an emission spectrum of the white LED lamp 1 using the Eu-activated halophosphate phosphor as the blue luminescent component, the Au and Al-activated zinc sulfide phosphor as the green luminescent component, and the Eu and Sm-activated lanthanum oxysulfide phosphor as the red luminescent component. An emission spectrum [B] is an emission spectrum of the white LED lamp 1 having the Cu and Mn-activated zinc sulfide phosphor added as the red luminescent component to the combination of the phosphors of the emission spectrum [A].

In a case where ultraviolet light from a LED chip having a current value of 20 mA and a peak value of 400 nm is converted to white light having (x, y) chromaticity values of (x=0.300 to 0.350, y=0.300 to 0.350), the blue luminescent component has a peak value of 450 nm, the green luminescent component has a peak value of 545 nm, and the red luminescent component has a peak value of 623 nm for both the phosphor combination [A] and the phosphor combination [B]. In addition, the characteristic values including an average color rendering index of 90 or more and luminance of 300 mcd or more are obtained.

It is seen by comparing the combination [A] and the combination [B] for the emission spectrum that the emission spectrum of the combination [B] has the luminescent component increased in a range around 580 nm and higher. It is because the Eu and Sm-activated lanthanum oxysulfide phosphor and the Cu and Mn-activated zinc sulfide phosphor are used together for the red luminescent component. It is possible to enhance furthermore the luminance characteristics of the white LED lamp 1.

The above-described individual phosphors of blue, green and red are dispersed into the transparent resin 8 as, for example, a mixture thereof. In this case, the individual phosphors are desired that their mixture has an average particle diameter of 7 μm or more. Here, the average particle diameter indicates an median value (value of 50%) of a grain size distribution. The white light-emitting phosphor (three-color mixed phosphor) 9 which is a mixture of the individual phosphors of blue, green and red is determined to have an average particle diameter of 7 μm or more, so that the luminance of the white LED lamp 1 can be further improved. The three-color mixed phosphor 9 has desirably an average particle diameter of 8 μm or more.

The upper limit of the average particle diameter of the three-color mixed phosphor 9 is not particularly limited but preferably 100 μm or less considering the formability and the like of the light-emitting part 10. If the average particle diameter of the three-color mixed phosphor 9 exceeds 100 μm, there is a possibility of causing problems that a flat surface is hardly obtained when its mixture with the transparent resin 8 is coated on the LED chip 2, and the like.

In addition, the individual phosphors of blue, green and red may be integrated into one body by a binder such as an inorganic binder or an organic binder in advance and dispersed in the obtained state into the transparent resin 8 in order to improve the uniformity in the state dispersed into the transparent resin 8. A pulverized alkaline earth borate or the like can be used as the inorganic binder, and a transparent resin such as an acrylic resin, a silicone resin or the like can be used as the organic binder. When the inorganic binder or the organic binder is used to perform the integration processing, the individual phosphors are adhered at random to have a large particle diameter.

Thus, the nonuniformity of the dispersed state of the individual phosphors in the transparent resin 8 due to a difference in settling rate or the like is remedied, so that the reproducibility of white light and the uniformity of light emission can be improved. To obtain the effect based on the integration processing with a good reproducibility, the white light-emitting phosphor (integrated phosphor) 9 which is integrated by the binder is desirable that its average primary particle diameter is 7 μm or more before the integration, and its average secondary particle diameter is 10 μm or more after the integration. If the average secondary particle diameter is less than 10 μm, sufficient effects might not be obtained by the integration processing.

The upper limit of the average secondary particle diameter of the integrated phosphor 9 is not particularly limited but desirably 100 μm or less considering the formability and the like of the light-emitting part 10. If the average secondary particle diameter of the integrated phosphor 9 exceeds 100 μm, there is a possibility of a problem that it is hard to form a flat surface on the LED chip 2 because of mixing with the transparent resin 8. The effect of improving the luminance based on the average particle diameter is also effective for the phosphor which has been undergone the integration processing. Therefore, it is desirable that the individual phosphors before the integration are determined to have an average primary particle diameter of 7 μm or more.

The white LED lamp 1 of this embodiment is used for, for example, the backlight of various types of displays, which are represented by a liquid crystal display, and various types of illuminating devices. The liquid crystal display provided with the backlight using the white LED lamp 1 can be applied to the display unit of various types of equipment such as portable communication devices, PC peripheral devices, office automation equipment, home electric appliances, and the like. The illuminating device using the white LED lamp 1 can be used as signal equipment, various types of switches, vehicle-mounted lamps, and also general illuminating devices and the like.

Figure 4:
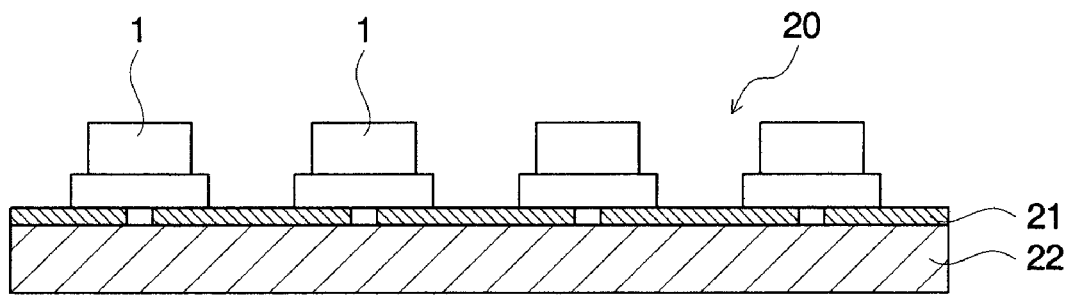
FIG. 4 is a diagram showing a structure of the backlight according to an embodiment of the invention.

FIG. 4 is a diagram showing an outline structure of the backlight according to an embodiment of the invention. A backlight 20 shown in the figure has plural white LED lamps 1 which are arranged in a linear or matrix form. These white LED lamps 1 are mounted on a substrate 22 which has a wiring layer 21, and the individual lead terminals of the white LED lamps 1 are electrically connected to the wiring layer 21. The plural white LED lamps 1 are sequentially connected in series. The light emitting device of the backlight 20 is not limited to the LED lamps 1, but a light emitting device which applies a semiconductor light-emitting device such as a laser diode to the light source can be used.

Figure 5:
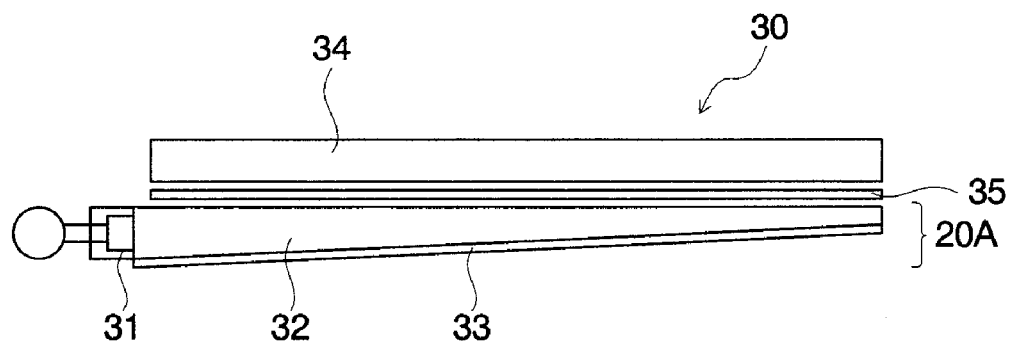
FIG. 5 is a diagram showing a structure of the liquid crystal display according to an embodiment of the invention.
Figure 6:
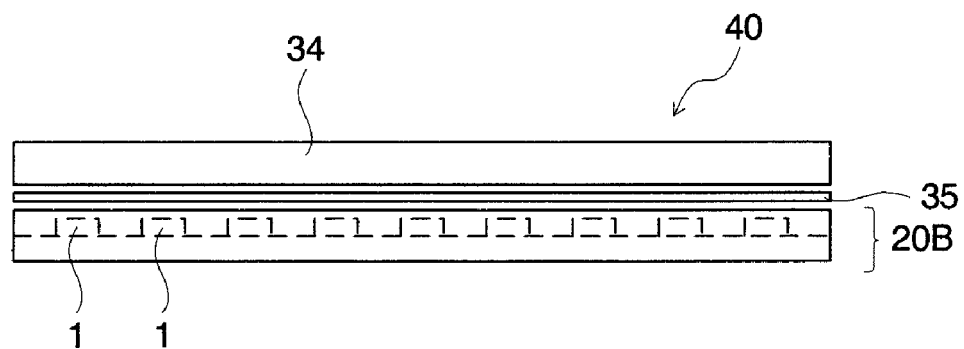
FIG. 6 is a diagram showing a structure of the liquid crystal display according to another embodiment of the invention.

The backlight 20 is applied to liquid crystal displays 30, 40 shown in, for example, FIG. 5 and FIG. 6. The liquid crystal displays 30, 40 shown in these figures indicate embodiments of the liquid crystal display of the invention. FIG. 5 shows the liquid crystal display 30 applying a sidelight type backlight 20A. The sidelight type backlight 20A has an emission system 31 using the white LED lamp 1 and a light guide plate 32. The light guide plate 32 is determined to have a light incident portion at its one end where the light-emitting part 31 is disposed.

The light guide plate 32 is tapered from the end having the light incident portion toward the other end, and a reflective layer 33 is disposed on the bottom surface of the tapered portion. Light radiated from the emission system 31 repeats refraction and reflection within the light guide plate 32 and is irradiated from the upper surface of the light guide plate 32 in its normal direction. A transmissive or semi-transmissive color liquid crystal display unit 34 is disposed on the side of the light emission surface of the sidelight type backlight 20A, thereby configuring the liquid crystal display 30. An optical sheet 35 such as a diffusion sheet, a reflection sheet or the like may be disposed between the sidelight type backlight 20A and the color liquid crystal display unit 34.

FIG. 6 shows the liquid crystal display 40 applying a directly-beneath type backlight 20B. The directly-beneath type backlight 20B has the white LED lamps 1 which are arranged in a matrix form according to the shape and area of the transmissive or semi-transmissive color liquid crystal display unit 34. The color liquid crystal display unit 34 is disposed directly in the light emission direction of the plural white LED lamps configuring the backlight 20B. The liquid crystal display 40 is comprised of the directly-beneath type backlight 20B and the color liquid crystal display unit 34 and, if necessary, the optical sheet 35 between them.

Then, specific examples of the present invention and the evaluated results will be described.

EXAMPLE 1

First, a Eu-activated alkali earth chlorophosphate (($Sr_{0.59}$, $Ca_{0.01}$, $Ba_{0.39}$, $Eu_{0.01}$)$_{10}$(PO$_4$)$_6$·Cl$_2$) phosphor as a blue light-emitting phosphor, a Au and Al-activated zinc sulfide phosphor (ZnS:$Au_{0.0008}$, $Al_{0.001}$) phosphor as a green light-emitting phosphor, and a Eu and Sm-activated lanthanum oxysulfide (($La_{0.94}$, $Eu_{0.058}$, $Sm_{0.002}$)$_2$O$_2$S) phosphor as a red light-emitting phosphor were prepared.

The above-described blue light-emitting phosphor, green light-emitting phosphor and red light-emitting phosphor were weighed in 1.74 g, 2.17 g and 2.33 g and mixed by three rollers. The individual phosphors were determined to have a mixing ratio that the CIE chromaticity values (x, y) of the LED lamp are in a range of x=0.30 to 0.31 and y=0.30 to 0.31. The same is also applied to Examples 2 to 10 and Comparative Example 1 described below. The mixture of the individual phosphors had an average particle diameter (dispersion median diameter) of 9.5 μm. The obtained mixture phosphor was used to produce the white LED lamp 1 shown in FIG. 1.

The LED lamp 1 was produced as described below. First, the mixture phosphor in 30 mass % was added to and mixed with a silicone resin which forms the transparent resin 8 to prepare slurry. The slurry was dripped onto an ultraviolet emission LED chip 2 having an emission peak wavelength of 400 nm and a shape of 300 μm square, and the silicone resin was cured at 140° C. Thus, the ultraviolet emission LED chip 2 was sealed with the silicone resin containing the mixture phosphor (mixture phosphor of blue, green and red). The obtained white LED lamp was subjected to the characteristic evaluation to be described later.

EXAMPLE 2

The same phosphors in the same amounts as in Example 1 were prepared and integrated into one body by the method described below. In the integrating step, to the individual phosphors were added an acrylic resin emulsion at a ratio of 0.1 mass % in solid content ratio to the phosphor, and they were mixed. Then, the mixture was dried at 120° C. and covered with a nylon mesh to obtain an integrated phosphor. An average primary particle diameter before the integration was 9.5 μm, and the average secondary particle diameter after the integration was 17.6 μm. The integrated phosphor was used to produce a white LED lamp in the same manner as in Example 1. The produced white LED lamp was subjected to the characteristic evaluation to be described later.

EXAMPLE 3

In addition to the same individual phosphors as in Example 1, a Cu and Mn-activated zinc sulfide (ZnS:$Cu_{0.0005}$, $Mn_{0.008}$) phosphor was prepared as a red light-emitting phosphor. A Eu-activated alkali earth chlorophosphate, an Au and Al-activated zinc sulfide phosphor, a Eu and Sm-activated lanthanum oxysulfide phosphor and a Cu and Mn-activated zinc sulfide phosphor were weighed in 2.10 g, 2.22 g, 2.10 g and 0.82 g. They were mixed in the same manner as in Example 1. The mixture of the individual phosphors had an average particle diameter of 9.8 μm. The mixed phosphor was used to produce a white LED lamp in the same manner as in Example 1. The produced white LED lamp was subjected to the characteristic evaluation to be described later.

EXAMPLES 4 TO 11

Mixed phosphors or integrated phosphors were produced in the same manner as in Example 1 or Example 2 except that the combination of blue, green and red light-emitting phosphors shown in Table 1 was applied. The individual mixed phosphors or integrated phosphors were used to produce white LED lamps in the same manner as in Example 1. The produced white LED lamps were subjected to the characteristic evaluation to be described later.

COMPARATIVE EXAMPLE 1

A Eu-activated alkali earth chlorophosphate ((Sr, Ca, Ba, Eu)$_{10}$ (PO$_4$)$_6$·Cl$_2$) phosphor as a blue light-emitting phosphor, a Eu and Mn-activated alkaline earth aluminate (3(Ba, Mg, Eu, Mn)O·8Al$_2$O$_3$) phosphor as a green light-emitting phosphor, and a Eu-activated lanthanum oxysulfide ((La, Eu)$_2$O$_2$S) phosphor as a red light-emitting phosphor were prepared. The blue light-emitting phosphor, the green light-emitting phosphor and the red light-emitting phosphor were weighed in 1.44 g, 1.49 g and 3.32 g, and they were mixed by three rollers. The mixed phosphor was used to produce a white LED lamp in the same manner as in Example 1. The produced lamp was subjected to the characteristic evaluation to be described later.

COMPARATIVE EXAMPLE 2

A Eu-activated alkali earth chlorophosphate ((Sr, Ca, Ba, Eu)$_{10}$(PO$_4$)$_6$·Cl$_2$) phosphor as a blue light-emitting phosphor, a Eu-activated alkaline-earth silicate ((Ba, Sr, Ca, Eu)$_2$SiO$_4$) phosphor as a green light-emitting phosphor, and a Eu-activated lanthanum oxysulfide ((La, Eu)$_2$O$_2$S) phosphor as a red light-emitting phosphor were prepared. The blue light-emitting phosphor, the green light-emitting phosphor and the red light-emitting phosphor were weighed in 2.71 g, 0.45 g and 1.85 g, and they were mixed by three rollers. The mixed phosphor was used to produce a white LED lamp in the same manner as in Example 1. The produced lamp was subjected to the characteristic evaluation to be described later.

TABLE 1

|  | Blue light-emitting phosphor | Green light-emitting phosphor | Red light-emitting phosphor |
| --- | --- | --- | --- |
| Ex. 1 | (Sr,Ca,Ba,Eu)$_{10}$(PO$_4$)$_6$·Cl$_2$ | ZnS:Au,Al | (La,Eu,Sm)$_2$O$_2$S |
| Ex. 2 | (Sr,Ca,Ba,Eu)$_{10}$(PO$_4$)$_6$·Cl$_2$ | ZnS:Au,Al | (La,Eu,Sm)$_2$O$_2$S |

TABLE 1-continued

| | Blue light-emitting phosphor | Green light-emitting phosphor | Red light-emitting phosphor |
|---|---|---|---|
| Ex. 3 | $(Sr,Ca,Ba,Eu)_{10}(PO_4)_6 \cdot Cl_2$ | ZnS:Au,Al | $(La,Eu,Sm)_2O_2S(71.9\%)/$ $ZnS:Cu,Mn(28.1\%)$ |
| Ex. 4 | $(Sr,Ca,Ba,Eu)_{10}(PO_4)_6 \cdot Cl_2$ | ZnS:Au,Al | $(La,Eu,Sm)_2O_2S(71.9\%)/$ $ZnS:Cu,Mn(28.1\%)$ |
| Ex. 5 | $3(Ba,Mg,Eu)O \cdot 8Al_2O_3$ | ZnS:Au,Al | $(La,Eu,Sm)_2O_2S$ |
| Ex. 6 | $3(Ba,Mg,Eu)O \cdot 8Al_2O_3$ | ZnS:Au,Al | $(La,Eu,Sm)_2O_2S$ |
| Ex. 7 | $3(Ba,Mg,Eu)O \cdot 8Al_2O^3$ | ZnS:Au,Al | $(La,Eu,Sm)_2O_2S(68.5\%)/$ $ZnS:Cu,Mn(31.5\%)$ |
| Ex. 8 | $3(Ba,Mg,Eu)O \cdot 8Al_2O_3$ | ZnS:Au,Al | $(La,Eu,Sm)_2O_2S(68.5\%)/$ $ZnS:Cu,Mn(31.5\%)$ |
| Ex. 9 | $(Sr,Ca,Ba,Eu)_{10}(PO_4)_6 \cdot Cl_2(50\%)/$ $3(Ba,Mg,Eu)O \cdot 8Al_2O_3(50\%)$ | ZnS:Au,Al | $(La,Eu,Sm)_2O_2S$ |
| Ex. 10 | $(Sr,Ca,Ba,Eu)_{10}(PO_4)_6 \cdot Cl_2(50\%)/$ $3(Ba,Mg,Eu)O \cdot 8Al_2O_3(50\%)$ | ZnS:Au,Al | $(La,Eu,Sm)_2O_2S(70.2\%)/$ $ZnS:Cu,Mn(29.8\%)$ |
| Ex. 11 | $(Sr,Ca,Ba,Eu)_{10}(PO_4)_6 \cdot Cl_2$ | ZnS:Au,Al | $(La,Eu,Sm)_2O_2S$ |
| C. Ex. 1 | $(Sr,Ca,Ba,Eu)_{10}(PO_4)_6 \cdot Cl_2$ | $3(Ba,Mg,Eu,Mn)O \cdot 8Al_2O_3$ | $(La,Eu)_2O_2S$ |
| C. Ex. 2 | $(Sr,Ca,Ba,Eu)_{10}(PO_4)_6 \cdot Cl_2$ | $(Ba,Sr,Ca,Eu)_2SiO_4$ | $(La,Eu)_2O_2S$ |

Ex. = Example, C. Ex. = Comparative Example

TABLE 2

| | State of BGR phosphor | Average particle diameter of mixed phosphor (μm) | Average particle diameter of integrated phosphor | |
|---|---|---|---|---|
| | | | Average primary particle diameter (μm) | Average secondary particle diameter (μm) |
| Ex. 1 | Mixed phosphor | 9.5 | — | — |
| Ex. 2 | Integrated phosphor | — | 9.5 | 17.6 |
| Ex. 3 | Mixed phosphor | 9.8 | — | — |
| Ex. 4 | Integrated phosphor | — | 9.8 | 18.2 |
| Ex. 5 | Mixed phosphor | 8.5 | — | — |
| Ex. 6 | Integrated phosphor | — | 8.6 | 15.8 |
| Ex. 7 | Mixed phosphor | 8.8 | — | — |
| Ex. 8 | Integrated phosphor | — | 8.8 | 16.3 |
| Ex. 9 | Mixed phosphor | 9.0 | — | — |
| Ex. 10 | Mixed phosphor | 9.2 | — | — |
| Ex. 11 | Integrated phosphor | — | 30.2 | 70.5 |
| C. Ex. 1 | Mixed phosphor | 5.2 | — | — |
| C. Ex. 2 | Mixed phosphor | 6.5 | — | — |

Ex. = Example, C. Ex. = Comparative Example

Electric current of 20 mA was passed to the individual white LED lamps of Examples 1 to 11 and Comparative Examples 1 and 2 described above to illuminate them, and the individual white LED lamps were measured for emission luminance, average color rendering index, and chromaticity. The measured results are shown in Table 3. The individual white LED lamps were measured for the emission property by a CAS 140B COMPACT ARRAY SPECTROMETER produced by Instrument Systems and MCPD equipment produced by OTSUKA ELECTRONICS CO., LTD.

TABLE 3

| | Characteristics of white LED lamp | | |
|---|---|---|---|
| | Luminance(mcd) | Average color rendering index | Chromaticity (x, y) |
| Ex. 1 | 300 | 92 | (0.304, 0.302) |
| Ex. 2 | 305 | 92 | (0.304, 0.302) |
| Ex. 3 | 320 | 93 | (0.305, 0.303) |
| Ex. 4 | 320 | 93 | (0.305, 0.303) |
| Ex. 5 | 280 | 91 | (0.304, 0.302) |
| Ex. 6 | 280 | 91 | (0.304, 0.301) |
| Ex. 7 | 290 | 92 | (0.304, 0.302) |
| Ex. 8 | 295 | 92 | (0.304, 0.302) |
| Ex. 9 | 300 | 92 | (0.304, 0.302) |
| Ex. 10 | 305 | 91 | (0.303, 0.302) |
| Ex. 11 | 450 | 92 | (0.304, 0.303) |
| C. Ex. 1 | 150 | 70 | (0.304, 0.303) |
| C. Ex. 2 | 250 | 81 | (0.304, 0.302) |

Ex. = Example, C. Ex. = Comparative Example

It is apparent from Table 3 that the individual white LED lamps according to Examples 1 to 11 are excellent in color rendering properties and also excellent in luminance characteristics in comparison with Comparative Example 1 and Comparative Example 2. Therefore, both high color rendering properties and high luminance can be achieved by the white LED lamp using the ultraviolet emission LED. This white LED lamp can be used effectively for portable communication devices, PC peripheral devices, office automation equipment, home electric appliances, various types of switches, a component part of various types of displays such as backlight type display boards, and general illuminating devices.

INDUSTRIAL APPLICABILITY

The white light-emitting lamp of the invention uses a gold and aluminum-activated zinc sulfide phosphor which contains a larger amount of a long wavelength component as a green light-emitting phosphor, so that the luminescent component based on the red light-emitting phosphor can be reinforced. Thus, the luminance characteristics can be improved without impairing the inherent high color rendering properties of the white light-emitting lamp using the ultraviolet emission LED. The white light-emitting lamp having achieved both the high color rendering properties and the high luminance can be used effectively for various usages.

What is claimed is:

1. A white light-emitting lamp, comprising:
a semiconductor light-emitting device having an emission wavelength in a range of 360 nm or more and 440 nm or less; and
a light-emitting part, which is excited by light from the semiconductor light-emitting device to emit white light, including a blue light-emitting phosphor which is composed of at least one selected from a europium-activated halophosphate phosphor and a europium-activated aluminate phosphor, a green light-emitting phosphor which is composed of a gold and aluminum-activated zinc sulfide phosphor, and a red light-emitting phosphor which is composed of at least one selected from a europium and samarium-activated lanthanum oxysulfide phosphor and a copper and manganese-activated zinc sulfide phosphor, wherein
the gold and aluminum-activated zinc sulfide phosphor has a composition which is represented by the general formula:

$$ZnS:Au_x,Al_y$$

where, x and y are numbers meeting $0.0002 \leq x \leq 0.0015$, $0.0001 \leq y \leq 0.0012$.

2. The white light-emitting lamp according to claim 1, wherein the europium and samarium-activated lanthanum oxysulfide phosphor has a composition which is represented by the general formula:

$$(La_{1-a-b},Eu_a,Sm_b)_2O_2S$$

where, a and b are numbers meeting $0.01 \leq a \leq 0.15$, $0.0001 \leq b \leq 0.03$.

3. The white light-emitting lamp according to claim 1, wherein the copper and manganese-activated zinc sulfide phosphor has a composition which is represented by the general formula:

$$ZnS:Cu_v,Mn_w$$

where, v and w are numbers meeting $0.0002 \leq v \leq 0.001$, $0.005 \leq w \leq 0.014$.

4. The white light-emitting lamp according to claim 1, wherein the light-emitting part includes at least the europium and samarium-activated lanthanum oxysulfide phosphor as the red light-emitting phosphor.

5. The white light-emitting lamp according to claim 1, wherein the light-emitting part includes both the europium and samarium-activated lanthanum oxysulfide phosphor and the copper and manganese-activated zinc sulfide phosphor as the red light-emitting phosphor.

6. The white light-emitting lamp according to claim 5, wherein a mass ratio of the europium and samarium-activated lanthanum oxysulfide phosphor to the copper and manganese-activated zinc sulfide phosphor is in a range of 8:2 to 3:7.

7. The white light-emitting lamp according to claim 1, wherein the europium-activated halophosphate phosphor has a composition which is represented by the general formula:

$$(M1_{1-c},Eu_c)_{10}(PO_4)_6.Cl_2$$

where, M1 denotes at least one element selected from Mg, Ca, Sr and Ba, and c is a number meeting $0.005 \leq c \leq 0.03$.

8. The white light-emitting lamp according to claim 1, wherein the europium-activated aluminate phosphor has a composition which is represented by the general formula:

$$m(M2_{1-d},Eu_d)O.nAl_2O_3$$

where, M2 denotes at least one element selected from Mg, Ca, Sr, Ba and Zn, and d, m and n are numbers meeting $0.05 \leq d \leq 0.3$, $0 < m$, $0 < n$, $0.2 \leq m/n \leq 1.5$.

9. The white light-emitting lamp according to claim 1, wherein the light-emitting part has a resin layer in which the blue light-emitting phosphor, the green light-emitting phosphor and the red light-emitting phosphor are dispersed.

10. The white light-emitting lamp according to claim 9, wherein the blue light-emitting phosphor, the green light-emitting phosphor and the red light-emitting phosphor have an average particle diameter of 7 μm or more as their mixture.

11. The white light-emitting lamp according to claim 9, wherein the blue light-emitting phosphor, the green light-emitting phosphor and the red light-emitting phosphor are previously integrated into one body by a binder.

12. The white light-emitting lamp according to claim 11, wherein the blue light-emitting phosphor, the green light-emitting phosphor and the red light-emitting phosphor have an average primary particle diameter of 7 μm or more before their integration and an average secondary particle diameter of 10 μm or more after their integration.

13. The white light-emitting lamp according to claim 1, wherein the semiconductor light-emitting device has a light emitting diode or a laser diode.

14. A backlight, comprising the white light-emitting lamp according to claim 1.

15. A display, comprising:
a backlight provided with the white light-emitting lamp according to claim 1; and
a display unit which is disposed on a side of a light emission surface of the backlight.

16. The display according to claim 15, wherein the display unit has a transmissive or semi-transmissive liquid crystal display unit.

17. An illuminating device, comprising the white light-emitting lamp according to claim 1.

* * * * *